(12) United States Patent
Hsu

(10) Patent No.: US 7,940,079 B2
(45) Date of Patent: May 10, 2011

(54) INTEGRATED CIRCUITS AND METHODS FOR PROVIDING IMPEDANCE OF DRIVER TO DRIVE DATA

(75) Inventor: Ying-Yu Hsu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/723,005

(22) Filed: Mar. 12, 2010

(65) Prior Publication Data

US 2010/0244891 A1    Sep. 30, 2010

Related U.S. Application Data

(60) Provisional application No. 61/164,041, filed on Mar. 27, 2009.

(51) Int. Cl.
*H03K 17/16* (2006.01)

(52) U.S. Cl. .............................. 326/30; 326/86; 327/108
(58) Field of Classification Search .................... 326/30, 326/86; 327/108
See application file for complete search history.

(56) References Cited

U.S. PATENT DOCUMENTS

| | | | | |
|---|---|---|---|---|
| 6,642,742 | B1 * | 11/2003 | Loyer ............................. | 326/30 |
| 6,803,790 | B2 * | 10/2004 | Haycock et al. ................ | 326/82 |
| 6,909,305 | B1 * | 6/2005 | Li et al. ............................. | 326/30 |
| 7,038,486 | B2 * | 5/2006 | Aoyama et al. ................. | 326/30 |

* cited by examiner

*Primary Examiner* — Vibol Tan
(74) *Attorney, Agent, or Firm* — Lowe Hauptman Ham & Berner, LLP

(57) ABSTRACT

An integrated circuit includes a pad coupled with a driver. The driver is capable of driving data to the pad. The driver is capable of providing a first set of resistance data substantially fitting to a first curve and a second set of resistance data substantially fitting to a second curve. A portion of at least one of the first set of resistance data and the second set of resistance data is an impedance of the driver to drive data.

8 Claims, 4 Drawing Sheets

INTEGRATED CIRCUITS AND METHODS FOR PROVIDING IMPEDANCE OF DRIVER TO DRIVE DATA

CROSS-REFERENCE TO RELATED APPLICATIONS

The present application claims priority of U.S. Provisional Patent Application Ser. No. 61/164,041, filed on Mar. 27, 2009, which is incorporated herein by reference in its entirety.

TECHNICAL FIELD

The present disclosure relates generally to the field of semiconductor circuits, and more particularly, to integrated circuits and methods for providing impedances of drivers to drive data.

BACKGROUND

Memory circuits have been used in various applications. Conventionally, memory circuits can include dynamic random access memory (DRAM) and static random access memory (SRAM) circuits. To enhance accessing speeds of memory, synchronous dynamic random access memory (SDRAM) has been provided. Conventionally, SDRAM has a synchronous interface. By using the synchronous interface, SDRAM waits for a clock signal prior to responding to control inputs so as to synchronize with buses of computer systems. To further enhance speeds of SDRAM, a double-data-rate (DDR) interface has been developed and applied in industry. Later, DDR2, DDR3, and DDR4 were different updated versions of DDR SDRAM.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE APPLICATION

Figure 1:
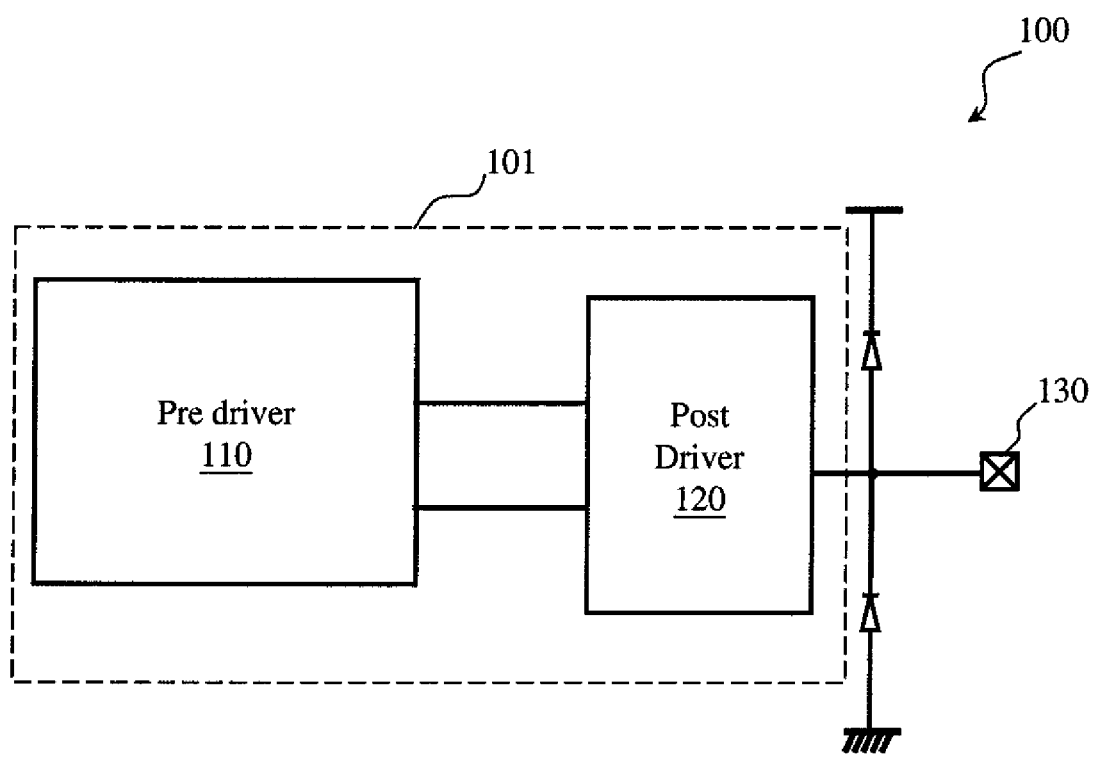
FIG. 1 is a schematic drawing showing an exemplary integrated circuit including a driver coupled with a pad.

SDRAM has a dual voltage three-state buffer having two level shifters to control a post driver circuit that is made of PMOS and NMOS transistors. The two level shifters translate lower voltage signals to higher voltage signals. The post driver circuit determines the output of the overall circuit by deciding which transistor is to be turned on or off.

Conventionally, SDRAM may use an on-die termination (ODT) technique. For the ODT technique, termination resistor for impedance matching in transmission lines is disposed in the post driver circuit. For impedance matching, the resistance of the post driver circuit should fall within specifications of DDR SDRAM. To adjust the resistance of the post driver circuit, each of the PMOS and NMOS transistors is connected to a resistor. A plurality of sets of the PMOS and NMOS transistors and resistors are disposed in a parallel fashion within the post driver circuit. By turning on or off some or all of the PMOS and NMOS transistors, the resistance of the post driver circuit can be adjusted.

It is found that for the ODT technique the resistors connected to the PMOS and NMOS transistors cost a large area of the post driver circuit. It is also found that fine tuning the resistance of the post driver circuit uses a plurality sets of PMOS and NMOS transistors and resistors. To turn on or off the plurality sets of PMOS and NMOS transistors, binary codes for controlling the post driver circuit may have at least 5 or 6 digits.

Based on the foregoing, integrated circuits and methods for providing impedances of drivers to drive data are desired.

It is understood that the following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing showing an exemplary integrated circuit including a driver coupled with a pad. In FIG. 1, an integrated circuit 100 can include a driver 101 and a pad 130. The driver 101 can be coupled with the pad 130, driving data to the pad 130. In some embodiments, the integrated circuit 100 can include a DDR SDRAM, a DDR2 SDRAM, a DDR3 SDRAM, a DDR4 SDRAM, a dynamic random access memory (DRAM) circuit, an embedded DRAM circuit, a static random access memory (SRAM) circuit, an embedded SRAM circuit, a non-volatile memory, e.g., FLASH, EPROM, EPROM, an embedded non-volatile memory, other integrated circuit, and/or combinations thereof.

In some embodiments, the driver 101 can include a pre driver 110 coupled with a post driver 120. The pre driver 110 is capable of receiving a plurality of codes to control the post driver 120. The post driver 120 can be coupled with a power source, e.g., an input/output (IO) power source (VDDIO), to drive data of the integrated circuit 100 to the pad 130. In embodiments using double-data-rate three synchronous dynamic random access memory (DDR3 SDRAM), the post driver 120 is capable of providing an impedance between about 216 ohms (Ω) and about 264Ω. It is noted that the specification of the impedance can vary with the standard of the SDRAM. One of skill in the art is able to change the impedance of the post driver 120 to meet DDR SDRAM standards.

Figure 2:
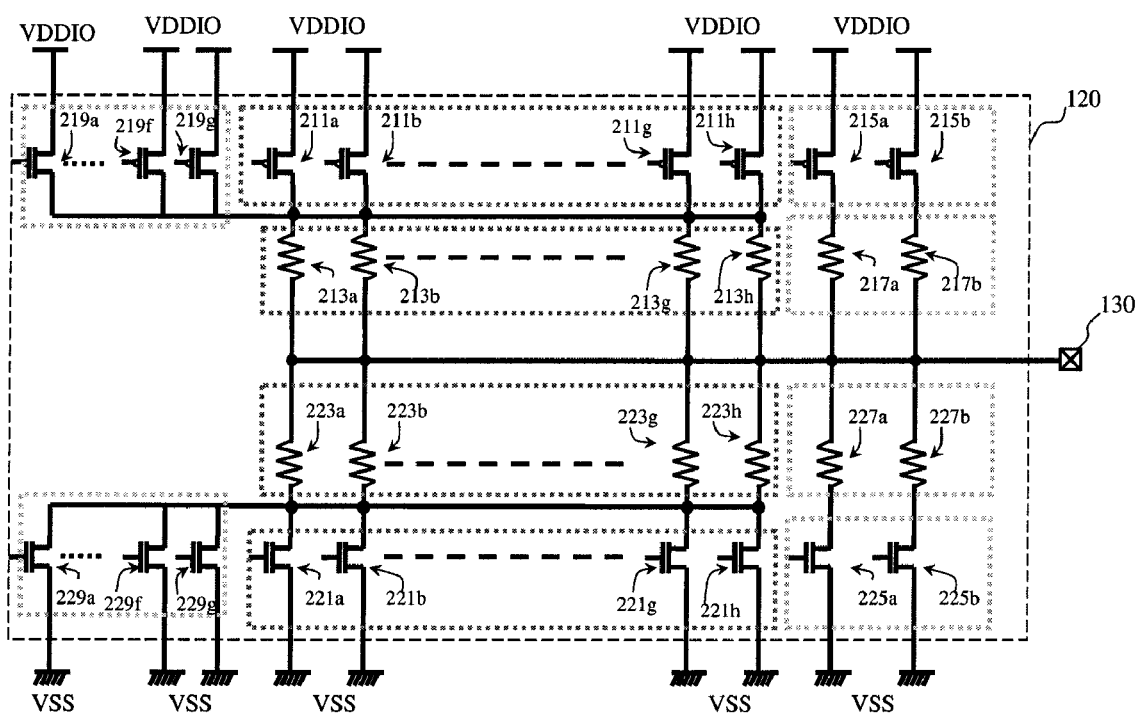
FIG. 2 is a schematic drawing showing an exemplary post driver.

FIG. 2 is a schematic drawing showing an exemplary post driver. In FIG. 2, the post driver 120 can include a first set of post-driver transistors 211a-211h coupled with a first power source, e.g., the IO power source VDDIO. The post driver 120 can include a first set of impedance devices 213a-213h. Each of the impedance devices 213a-213h can be coupled with their corresponding post-driver transistors 211a-211h and the pad 130. The post driver 120 can include a second set of post-driver transistors 215a-215b coupled with the power source VDDIO. The post driver 120 can include a second set of impedance devices 217a-217b. Each of the impedance devices 217a-217b can be coupled with their corresponding post-driver transistors 215a-215b. The post driver 120 can include a third set of post-driver transistors 219a-219g. Gates of the post-driver transistors 211a-211h, 215a-215b, and 219a-219g can be coupled with the pre driver 110 (shown in FIG. 1). The pre driver 110 can turn on or off the post-driver transistors 211a-211h, 215a-215b, and/or 219a-219g corresponding to the received codes. PAt least one of the post-driver transistors 219a-219g can be coupled with at least one node between the post-driver transistors 211a-211h and the impedance devices 213a-213h. In some embodiments, all of the post-driver transistors 219a-219g can be coupled with the nodes between the post-driver transistors 211a-211h and the impedance devices 213a-213h. In other embodiments, each of the post-driver transistors 219a-219g can be individually coupled with a node between each of the post-driver transistors 211a-211h and the corresponding impedance devices 213a-213h. PReferring again to FIG. 2, the post driver 120 can include a fourth set of post-driver transistors 221a-221h coupled with a second power source, e.g., ground, VSS, or a voltage lower than the power source VDDIO (hereinafter referred to as VSS). The post driver 120 can include a third set of impedance devices 223a-223h. Each of the impedance devices 223a-223h can be coupled with their corresponding post-driver transistors 221a-221h and the pad 130. The post driver 120 can include a fifth set of post-driver transistors 225a-225b coupled with the power source VSS. The post driver 120 can include a fourth set of impedance devices 227a-227b. Each of the impedance devices 227a-227b can be coupled with their corresponding post-driver transistors 225a-225b. The post driver 120 can include a sixth set of post-driver transistors 229a-229g. Gates of the post-driver transistors 221a-221h, 225a-225b, and 229a-229g can be coupled with the pre driver 110 (shown in FIG. 1). The pre driver 110 can turn on or off the post-driver transistors 221a-221h, 225a-225b, and/or 229a-229g corresponding to the received codes. PAt least one of the post-driver transistors 229a-229g can be coupled with at least one node between the post-driver transistors 221a-221h and the impedance devices 223a-223h. In embodiments, all of the post-driver transistors 229a-229g can be coupled with the nodes between the post-driver transistors 221a-221h and the impedance devices 223a-223h. In other embodiments, each of the post-driver transistors 229a-229g can be individually coupled with a node between each of the post-driver transistors 221a-221h and the corresponding impedance devices 223a-223h. PIn embodiments, each of the impedance devices 213a-213g, 217a-217b, 223a-223h, and 227a-227b can include a resistor, a transistor, and/or combinations thereof. In embodiments using DDR3, the VDDIO can be about 1.5 Volts. A ratio of the impedance of each of the impedance devices 213a-213h, 217a-217b, 223a-223h, and 227a-227b to their corresponding post-driver transistors 211a-221h, 215a-215b, 221a-221h, and 225a-225b can be between about 5:1 and about 6.5:1. In embodiments, the impedance of each of the impedance devices 213a-213h, 217a-217b, 223a-223h, and 227a-227b can be about 2,000Ω. The impedance of each of the post-driver transistors 211a-221h, 215a-215b, 221a-221h, and 225a-225b can be between about 300Ω and about 400Ω.

Figure 3:
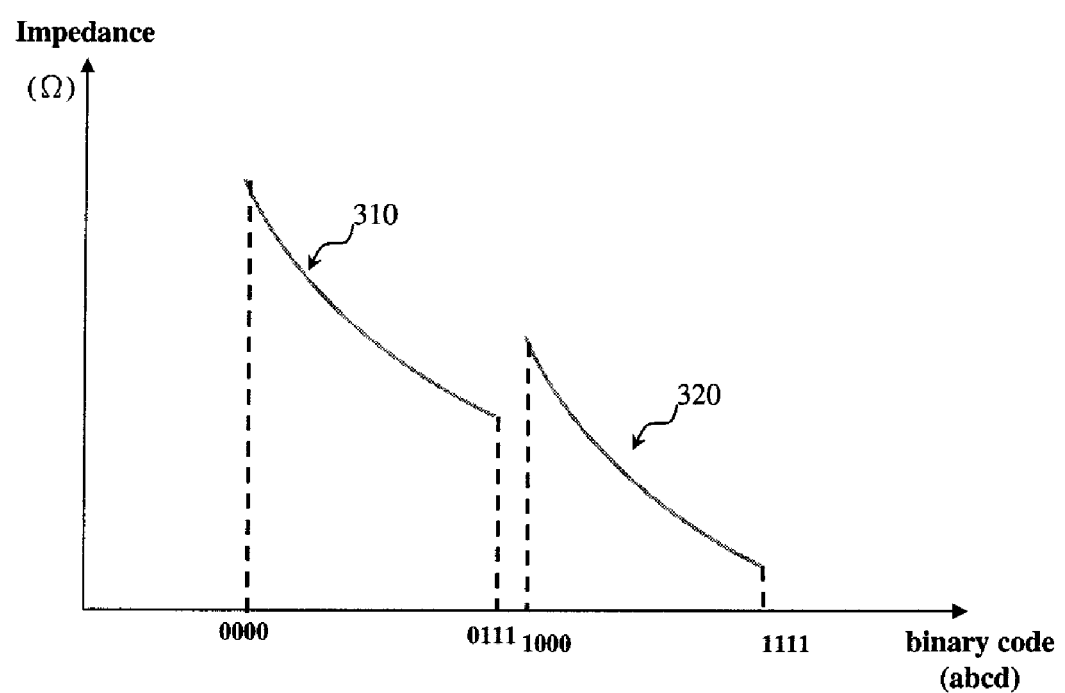
FIG. 3 is a simulation result showing a relationship between impedances of an exemplary post driver and binary codes for controlling the post driver providing the impedances.

The post driver 120 is capable of providing an impedance between about 216Ω and about 264Ω to drive data. PIn FIG. 2, the first set of post-driver transistors 211a-211h can have 8 PMOS transistors. The first set of impedance devices 213a-213h can have 8 resistors. The second set of post-driver transistors 215a-215b can have 2 PMOS transistors. The second set of impedance devices 217a-217b can have 2 resistors. The third set of post-driver transistors 219a-219g can have 7 PMOS transistors. The fourth set of post-driver transistors 221a-221h can have 8 NMOS transistors. The third set of impedance devices 223a-223h can have 8 resistors. The fifth set of post-driver transistors 225a-225b can have 2 NMOS transistors. The fourth set of impedance devices 227a-227b can have 2 resistors. The sixth set of post-driver transistors 229a-229g can have 7 NMOS transistors. It is noted that the sets, numbers, and types of the post-driver transistors and impedance devices shown in FIG. 2 are mere examples. One of skill in the art is capable of modifying the sets, numbers, and types of the post-driver transistors and impedance devices to achieve a desired impedance of the post driver 120. PFollowing are descriptions regarding exemplary methods for operating a post driver for providing desired impedances. FIG. 3 is a simulation result showing a relationship between impedances of an exemplary post driver and binary codes for controlling the post driver providing the impedances. As noted, the pre driver 110 (shown in FIG. 1) is capable of receiving codes for controlling the post driver 120. In embodiments, the codes can include binary codes, Gray codes, thermometer code, other suitable codes, and any combinations thereof. After receiving signals to output data, the pre driver 110 can turn on all of the post-driver transistors 211a-211h and/or 221a-221h (FIG. 2). The post-driver transistors 211a-211h and/or 221a-221h and their corresponding resistors 213a-213h and 223a-223h can provide a basic resistance. PIn embodiments receiving 4-digits binary codes "abcd," the first digit "a" can enable the pre driver 110 to turn on or off the post-driver transistors 215a-215b and/or 225a-225b. For example, "0bcd" of the binary code can enable the pre driver 110 to turn off all of the pos-driver transistors 215a-215b and/or 225a-225b and "1bcd" of the binary code can enable the pre driver 110 to turn on all of the pos-driver transistors 215a-215b and/or 225a-225b. The other three digits "bcd" of the binary codes can enable the pre driver 110 to turn on or off at least one of the post-driver transistors 219a-219g and/or 229a-229g. For example, the binary code "a000" can enable the pre driver 110 to turn off all of the post-driver transistors 219a-219g and/or 229a-229g and the binary code "a111" can enable the pre driver 110 to turn on all of the transistors 219a-219g and/or 229a-229g. Each of the binary codes "a100," "a010," "a001," "a110," a101," and "a011" can enable the pre driver 110 to selectively turn on one of the post-driver transistors 219a-219g and one of the post-driver transistors 229a-229g. PTable 1 shows two sets of resistance data for the DDR3 SDRAM standard provided by the post driver 120 controlled by various binary codes "abcd." P

TABLE 1

| bcd | a = 0 | a = 1 |
| --- | --- | --- |
| 000 | 304.89 Ω | 211.60 Ω |
| 001 | 282.40 Ω | 205.90 Ω |
| 010 | 263.00 Ω | 195.94 Ω |
| 011 | 248.72 Ω | 187.39 Ω |

TABLE 1-continued

| bcd | a = 0 | a = 1 |
|---|---|---|
| 100 | 235.87 Ω | 180.01 Ω |
| 101 | 224.95 Ω | 173.58 Ω |
| 110 | 215.58 Ω | 167.94 Ω |
| 111 | 207.36 Ω | 162.97 Ω |

In Table 1, the first set of resistance data, i.e., the middle column, can be provided by turning off all of the post-driver transistors 215a-215b and/or 225a-225b, ranging from about 305Ω to about 207Ω. The second set of resistance data, i.e., the left column, can be provided by turning on the post-driver transistors 215a-215b and/or 225a-225b, ranging from about 218Ω to about 163Ω. The first set of resistance data can substantially fit to a first curve 310 (shown in FIG. 3) and the second set of resistance data can substantially fit to a second curve 320. It is found that the lowest resistance, i.e., 207.36Ω, of the first set of resistance data is lower than the highest resistance, i.e., 217.60Ω, of the second set of resistance data.

As shown in Table 1, the highest resistance, i.e., 304.89Ω, of the first set of resistance data can be provided by turning on all of the post-driver transistors 211a-211h and/or 221a-221h and turning off the remaining post-driver transistors 215a-215b, 225a-225b, 219a-219g, and/or 229a-229g. The highest resistance, i.e., 217.60Ω, of the second set of resistance data can be provided by turning on all of the post-driver transistors 211a-211h, 221a-221h, 215a-215b, and/or 225a-225b and turning off the remaining post-driver transistors 219a-219g and/or 229a-229g.

The difference between the highest resistance, i.e., 304.89Ω, of the first set of resistance data and the highest resistance, i.e., 217.60Ω, of the second set of resistance data is about 87Ω. The first set of resistance data change from 304.89Ω, 282.40Ω, 263.00Ω, 248.72Ω, 235.87Ω, 224.95Ω, 215.58Ω, to 207.36Ω. The difference between two neighboring resistance data changes from about 22Ω, 19Ω, 14Ω, 13Ω, 11Ω, 9Ω, and 8Ω. The second set of resistance data change from 217.60Ω, 205.90Ω, 195.94Ω, 187.39Ω, 180.01Ω, 173.58Ω, 167.94Ω, to 162.97Ω. The difference between two neighboring resistance data changes from about 12Ω, 10Ω, 8Ω, 7Ω, 6Ω, 6Ω, and 5Ω. It is found that the difference, i.e., about 87Ω, between the highest resistances of the first set and second set resistance data is much larger than any difference of two neighboring resistance data of the first set or second set resistance data. In some embodiments, a ratio of the resistance difference between the highest resistances of the first set and second set resistance data to any difference of two neighboring resistance data of the first set or second set resistance data is about 4:1 or more.

As noted, the first digit "a" of the binary code can enable the pre driver 110 to turn on or off the post-driver transistors 215a-215b and/or 225a-225b, resulting the 87-Ω resistance difference. The first digit "a" of the binary code and the post-driver transistors 215a-215b, 225a-225b and the resistors 217a-217b, 227a-227b can provide a coarse resistance tuning for the post driver 120. The remaining digits "bcd" of the binary code can enable the pre driver 110 to selectively turn on or off the post-driver transistors 219a-219g and/or 229a-229g, resulting resistance differences smaller than the 87-Ω resistance difference. The digits "bcd" of the binary code and the post-driver transistors 219a-219g and 229a-229g can provide a fine resistance tuning for the post driver 120.

In embodiments using the DDR3 SDRAM standard, the impedance of the post driver 120 can range from about 264Ω and about 216Ω. Referring to Table 1, the resistance data 263.00Ω, 248.72Ω, 235.87Ω, and 224.95Ω fall within the range and can selected as the impedances of the post driver 120. The four-digit binary codes can control the pre driver 110 to turn off all of the post-driver transistors 215a-215b and/or 225a-225b and turn on at least one of the post-driver transistors 219a-219g and/or 229a-229g. The portion of the first set of the resistance data can meet the DDR3 SDRAM standard. Contrary to a conventional post driver using five or more digits binary code to provide fine tunings for the resistance of the post driver, the post driver 120 uses fewer digits of binary codes.

It is found that the portion of the post driver 120 for providing the fine tunings of the resistance, i.e., the post-driver transistors 219a-219g and 229a-229g, is substantially free from including impedance devices, e.g., resistors and/or transistors. The area of the post driver 120 can be desirably reduced. The post-driver transistors 219a-219g and 229a-229g can provide desired fine resistance differences.

Figure 4:
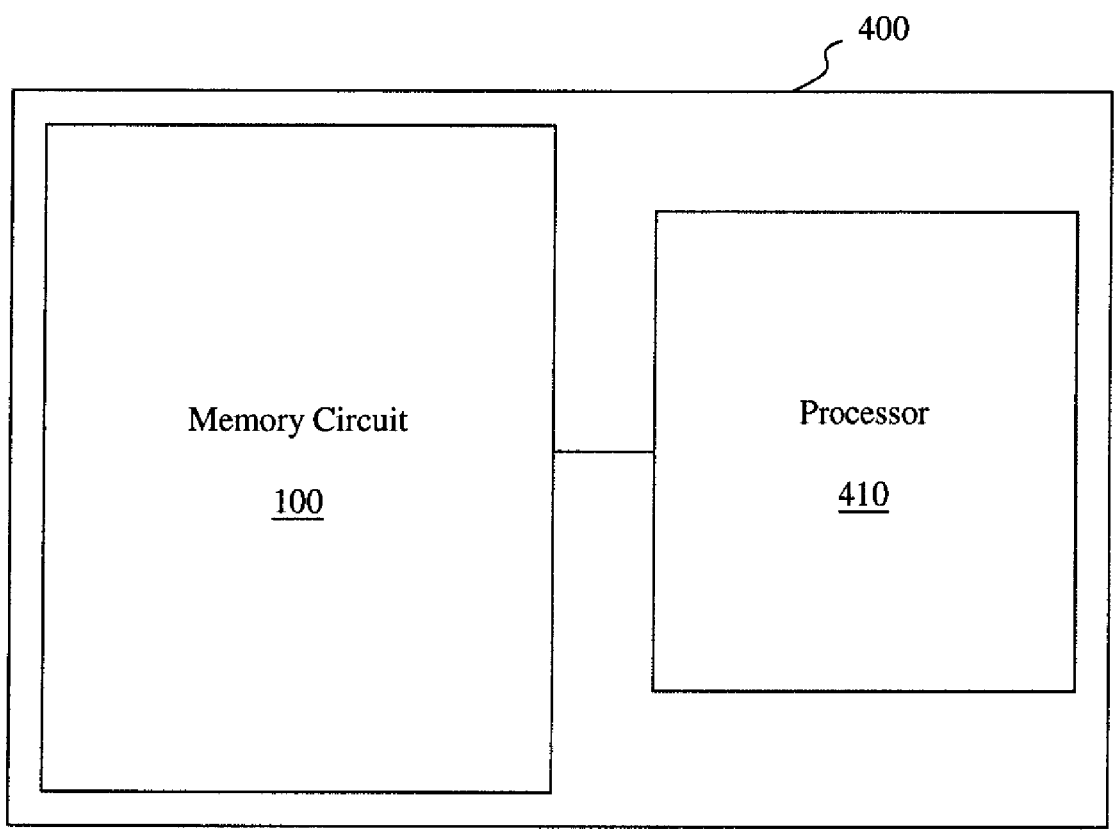
FIG. 4 is a schematic drawing showing a system including an exemplary memory circuit.

FIG. 4 is a schematic drawing showing a system including an exemplary memory circuit. In FIG. 4, a system 400 can include a processor 410 coupled with the integrated circuit 100. The processor 410 is capable of accessing the datum stored in the integrated circuit 100. In some embodiments, the processor 410 can be a processing unit, central processing unit, digital signal processor, or other processor that is suitable for accessing data of the integrated circuit 100.

In some embodiments, the processor 410 and the integrated circuit 100 can be formed within a system that can be physically and electrically coupled with a printed wiring board or printed circuit board (PCB) to form an electronic assembly. The electronic assembly can be part of electronic systems such as computers, wireless communication devices, computer-related peripherals, entertainment devices, or the like.

In some embodiments, the system 400 including the integrated circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a pre driver adapted to output a binary code;
   a pad; and
   a driver coupled with the pad, the driver being capable of driving data to the pad, wherein the driver comprises:
      a first set of post-driver transistors having at least one first post-driver transistor coupled with a first power source;
      a first set of impedance devices having at least one first impedance device coupled with the first set of post-driver transistors and the pad;

a second set of post-driver transistors having at least one second post-driver transistor coupled with the first power source;

a second set of impedance devices having at least one second impedance device coupled with the second set of post-driver transistors and the pad;

a third set of post-driver transistors having at least one third post-driver transistor coupled with a node between the first set of post-driver transistors and the first impedance device; and gates of the first, the second and the third set of post-driver transistors adapted to receive the output binary code, the gates of the third set of post-driver transistors receiving lower significant bits of the output binary code than the first and the second set of post-driver transistors.

2. The integrated circuit of claim 1, wherein the driver further comprises:

a fourth set of post-driver transistors having at least one fourth post-driver transistor coupled with a second power source;

a third set of impedance devices having at least one third impedance device coupled with the fourth set of post-driver transistors and the pad;

a fifth set of post-driver transistors having at least one fifth post-driver transistor coupled with the second power source;

a fourth set of impedance devices having at least one fourth impedance device coupled with the fifth set of post-driver transistors and the pad;

a sixth set of post-driver transistors having at least one sixth post-driver transistor coupled with a node between the fourth set of post-driver transistors and the third impedance device; and gates of the fourth, the fifth and the sixth set of post-driver transistors adapted to receive the output binary code, the gates of the sixth set of post-driver transistors receiving lower significant bits of the output binary code than the fourth and the fifth set of post-driver transistors.

3. The integrated circuit of claim 2, wherein the driver is capable of providing to the pad, a first set of resistance values based on a first set of values of the binary code and a second set of resistance values based on a second set of values of the binary code, a lowest resistance of the first set of resistance values being lower than a highest resistance of the second set of resistance values, and the resistance values are the impedance of the driver to drive data.

4. The integrated circuit of claim 3, wherein the integrated circuit is adapted to provide the lowest resistance of the first set of resistance values by turning on the first set of post-driver transistors and the third set of post-driver transistors or by turning on the fourth set of post-driver transistors and the sixth set of post-driver transistors.

5. The integrated circuit of claim 3, wherein the integrated circuit is adapted to provide the highest resistance of the second set of resistance values by turning on the first set of post-driver transistors and the second set of post-driver transistors or by turning on the fourth set of post-driver transistors and the fifth set of post-driver transistors.

6. The integrated circuit of claim 3, wherein each of the first set of impedance devices, the second set of impedance devices, the third set of impedance devices, and the fourth set of impedance devices includes a resistor, transistor, or combinations thereof.

7. The integrated circuit of claim 3, wherein the first set of post-driver transistors include 8 PMOS transistors, the first set of impedance devices include 8 resistors, the second set of post-driver transistors include 2 PMOS transistors, the second set of impedance devices include 2 resistors, the third set of post-driver transistors include 7 PMOS transistors, the fourth set of post-driver transistors include 8 NMOS transistors, the third set of impedance devices include 8 resistors, the fifth set of post-driver transistors include 2 NMOS transistors, the fourth set of impedance devices include two resistors, and the sixth set of post-driver transistors include 7 NMOS transistors.

8. The integrated circuit of claim 3, wherein a ratio of a resistance difference between the highest resistances of the first set and the second set of resistance values to a resistance difference of two neighboring resistance data of the first set or the second set of resistance values is about 4:1 or more.

* * * * *